United States Patent [19]
Shimada et al.

[11] Patent Number: 5,821,637
[45] Date of Patent: Oct. 13, 1998

[54] COMMUNICATION APPARATUS FOR CONVERTING AN UNBALANCED SIGNAL INTO A BALANCED SIGNAL

[75] Inventors: Shōzō Shimada; Noboru Nakama; Tsutomu Takahashi; Hiroshi Kadoya; Junichi Hayama, all of Kawasaki, Japan

[73] Assignee: Fujitsu Limited, Kanagawa, Japan

[21] Appl. No.: 774,105

[22] Filed: Dec. 24, 1996

Related U.S. Application Data

[62] Division of Ser. No. 333,508, Nov. 2, 1994.

[30] Foreign Application Priority Data

May 19, 1994 [JP] Japan .................................. 6-105174

[51] Int. Cl.$^6$ ....................................................... H04B 3/28
[52] U.S. Cl. ............................ 307/91; 307/147; 307/152; 340/310.05
[58] Field of Search ............................. 307/91, 147, 152; 340/310.01, 310.05; 375/222; 174/36, 102 R, 108, 117 F, 126.2

[56] References Cited

U.S. PATENT DOCUMENTS

| 4,489,998 | 12/1984 | Asick et al. ........................ 439/62 |
|---|---|---|
| 4,631,637 | 12/1986 | Romania ................................. 361/788 |
| 5,032,819 | 7/1991 | Sakuragi et al. ................... 340/310.05 |
| 5,348,482 | 9/1994 | Rudy, Jr. et al. ......................... 439/61 |
| 5,483,020 | 1/1996 | Hardie et al. ............................. 174/36 |

FOREIGN PATENT DOCUMENTS 3-68259 3/1991 Japan .

*Primary Examiner*—Jonathan Wysock
*Assistant Examiner*—Jonathan S. Kaplan
*Attorney, Agent, or Firm*—Helfgott & Karas, P.C.

[57] ABSTRACT

A communication apparatus is provided which permits system configuration to be freely changed even after electronic circuit boards are mounted to a shelf. The apparatus is a combination of an open rack and a shelf mounted on the rack, office cables for interconnecting external electronic devices are guided toward the rear of the apparatus and connected directly to external connectors of the electronic circuit boards, and a back wiring board is arranged on the rear surface of the shelf and has sheet connectors to which power supply connectors of the electronic circuit boards are connected.

2 Claims, 13 Drawing Sheets

COMMUNICATION APPARATUS FOR CONVERTING AN UNBALANCED SIGNAL INTO A BALANCED SIGNAL

This is a division of application Ser. No. 08/333,508, filed Nov. 2, 1994 pending.

BACKGROUND OF THE INVENTION (1) Field of the Invention

The present invention relates to a communication apparatus, and more particularly, to a communication apparatus interposed between an exchange and a transmitter or between transmitters in a digital transmission system such as an optical communication system.

(2) Description of the Related Art

In optical communication systems, communication apparatuses including multiplexers are connected between an analog or digital exchange and an optical communication network. The communication apparatuses can be categorized according to frequencies to deal with, i.e., according to predetermined transmission speeds. Generally, each communication apparatus is mounted to a casing or a shelf, and the casing or shelf is mounted on a frame or a rack.

The communication apparatus has a plurality of electronic circuit boards detachably mounted thereto. Specifically, the casing for the communication apparatus has a plurality of shelves therein, and guide members are formed at each of upper and lower walls of the shelf and extend in a direction along which the electronic circuit board is slid for attachment or detachment. The electronic circuit board is inserted along the guide members, whereby the circuit board is mounted to the shelf of the casing. At this time, electrical connection is established between the electronic circuit board and a back wiring board arranged at the rear of the shelf. Namely, mating connectors are formed respectively at each electronic circuit board and the back wiring board, and mechanical connection of these connectors achieves electrical connection among the electronic circuit boards via the back wiring board.

Further, it is necessary that signals be transferred between an electronic circuit board and another electronic circuit board in the same electronic device or an external electronic device. To this end, connectors connected to office cables are fixed to the frame, a small-sized casing with a back wiring board, which is called a block, is fixed at the position where the office cable connectors are fixed, and an electronic circuit board is mounted to the block, whereby electrical connection is achieved between external connectors formed on the electronic circuit board and the office cable connectors fixed to the frame.

Some communication apparatuses include duplex electronic circuit boards, for example, two power supply packages, for redundant operation or to improve the reliability. When one of the power supply packages fails, it is replaced with a new one. On the other hand, when the number of channels is to be increased, for example, an additional electronic circuit board(s) need be connected. Thus, in cases where electronic circuit boards are replaced or newly added, it is necessary that the electronic circuit boards be detached from or attached to the connectors associated therewith.

When an electronic circuit board is detached or attached, the power supply voltage is liable to temporarily lower. For example, where two power supply packages, one for current use and the other for standby reserve, are used for parallel operation, each package bears half of the load current. If the power supply package for current use, for example, is detached, the power supply package for standby reserve is required to bear a load current which is twice the current it has been bearing. In such a case, although a DC/DC converter of the power supply package for standby reserve performs a control action such that a twofold load current flows, the control action is subject to time lag, possibly causing an instantaneous voltage drop. As a result, load-side packages may fail to function properly, due to the instantaneous voltage drop, thus causing a channel error and lowering the quality of channels. Further, when a package is additionally connected to the load side, a very large rush current flows through the package for a short time, similarly causing an instantaneous drop of the power supply voltage and a channel error. To eliminate the drawback, conventionally large-capacity bypass capacitors are directly soldered to sheet connectors associated with the respective back wiring boards of the power supply packages for current use and standby reserve, to absorb sudden fluctuations in the power supply voltage.

The communication apparatuses are classified according to frequencies to deal with, as mentioned above; for example, they include apparatuses associated with a first-order speed of up to 2 Mb/s (megabits per second), apparatuses associated with a second-order speed of up to 8 Mb/s, apparatuses associated with a third-order speed of up to 34 Mb/s, apparatuses associated with a fourth-order speed of up to 140 Mb/s, and apparatuses associated with a speed higher than the fourth-order speed. These apparatuses can be directly connected to one another; in general, electrical signals are transferred among the apparatuses via digital distribution frame devices (hereinafter referred to as "DDF devices").

The DDF device is used for the following reasons: In cases where apparatuses from different manufacturers are used, connectors for wiring, terminals, and types of cables used in the apparatuses often differ from manufacturer to manufacturer, requiring interfacing points for resolving the differences. Also, when apparatuses are installed at different times, interfacing points that permit the wiring to be switched for the individual apparatuses are required in order to enhance the efficiency of the installation work. Further, since rewiring after installation consumes a great deal of man-hours and cost, interfacing points that facilitate rewiring, such as jumper lines, are needed. In many cases, connections of signal lines are performed at the back of the apparatuses; therefore, signal monitoring during on-site adjustment or maintenance need be conducted at the front side, not the rear side, of the apparatuses. To meet the requirements, the DDF device provides a line switching function by means of jumper lines and a signal monitoring function, and thus is indispensable to the communication apparatuses.

DDF devices can be generally classified into three types, i.e., low-frequency 75-Ω DDF device, low-frequency 120-Ω DDF device, and high-frequency DDF device. The low-frequency 75-Ω DDF device and the high-frequency DDF device are used for the connection with unbalanced coaxial lines, while the low-frequency 120-Ω DDF device is used for the connection with balanced paired wires. Thus, even in the case of low-frequency devices, customer's interface may be of 75-Ω impedance or 120-Ω impedance.

In the low-frequency 75-Ω DDF device, input/output signal lines and jumper lines are both coaxial lines and thus coaxial connectors therefor occupy a large area, making it difficult to reduce the size of the device. Apparatuses for dealing with low-frequency input/output signals require two types of connectors, i.e., flat connectors to be connected to paired wires and coaxial connectors to be connected to coaxial lines, thus requiring a large area for the connectors and increasing the size of the apparatuses. In conventional DDF devices, therefore, connectors connected to the apparatuses are limited to wrap-type flat connectors, for example. In the case of the low-frequency 120-Ω DDF device, paired wires therefrom are directly wrap-connected to connectors of the apparatuses. For the low-frequency 75-Ω DDF device, coaxial lines therefrom are each extended to the vicinity of the corresponding apparatus and connected to a coaxial-line/ single-conductor converting member, the two lines from which are wrap-connected to connectors of the apparatus. Alternatively, the apparatus is designed to have a 75-Ω impedance/120-Ω impedance conversion function, and switching is effected according to the impedance of wiring.

In the conventional communication apparatus, however, the connectors connected to other electronic circuit boards in the apparatus and the connectors connected to external devices are fixed to the frame, making it difficult to perform rewiring after the wiring inside the frame is once completed, and rewiring work, if performed, is very costly. Further, with regard to the connection with other electronic circuit boards via the back wiring board, once the wiring is carried out, the position of the electronic circuit board is uniquely determined, because the connectors associated with the shelf are determined or main signals pass the back wiring board. Furthermore, since the back wiring board is specially designed, the cost is high, and it is difficult to change the shelves.

The bypass capacitors, which serve to suppress channel error caused by instantaneous fluctuation in the power supply voltage at the time of attachment or detachment of a package, are directly soldered to the sheet connectors on the back wiring board. It is, therefore, difficult to replace the bypass capacitor when the service life thereof expires or the bypass capacitor fails, which may lead to long-term disconnection of channels.

In DDF devices for interconnecting apparatuses, particularly the 75-Ω DDF device, coaxial lines are extended to the vicinities of the apparatuses, requiring much space for the cables. Further, since the number of coaxial lines is large and a coaxial-line/single-conductor converting member must be provided between each coaxial line and the apparatus, the efficiency of wiring work is low. If such connection work is performed by an inexperienced person, error may occur due to loose contact. Apparatuses for dealing with low-frequency input/output signals have a 75-Ω interface or 120-Ω interface; therefore, they need to have the impedance conversion function. Further, since wires connected to the low-frequency 75-Ω DDF device are all coaxial lines, they occupy a large area, and thus the number of channels is small due to limited mounting space.

SUMMARY OF THE INVENTION

The present invention was created in view of the above circumstances, and an object thereof is to provide a communication apparatus which permits connectors connected to external devices to be connected to the rear side thereof and which facilitates system reconfiguration even after electronic circuit boards having necessary functions are mounted to a shelf.

Another object of the present invention is to provide a communication apparatus wherein a bypass capacitor, which serves to eliminate channel error caused at the time of attachment or detachment of a package, can be replaced when the service life thereof expires, for example, and the mounting space is minimized.

Still another object of the present invention is to provide a DDF device which employs only one type of input/output signal lines to be connected to an apparatus for dealing with low-frequency input/output signals and which improves the efficiency of wiring work at the vicinities of the apparatus.

To achieve the above objects, the present invention provides a communication apparatus arranged between an exchange and a transmitter or between transmitters. The communication apparatus comprises a shelf mounted on an open rack, an electronic circuit board mounted to the shelf and having a rear end portion provided with an external line connector, to which an external line is directly connected, and a power supply connector, the electronic circuit board being inserted from a front side of the shelf, and a back wiring board arranged on a rear surface of the shelf and having a sheet connector connected to the power supply connector of the electronic circuit board to establish electrical connection.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments according to the present invention will be outlined first.

Figure 1:
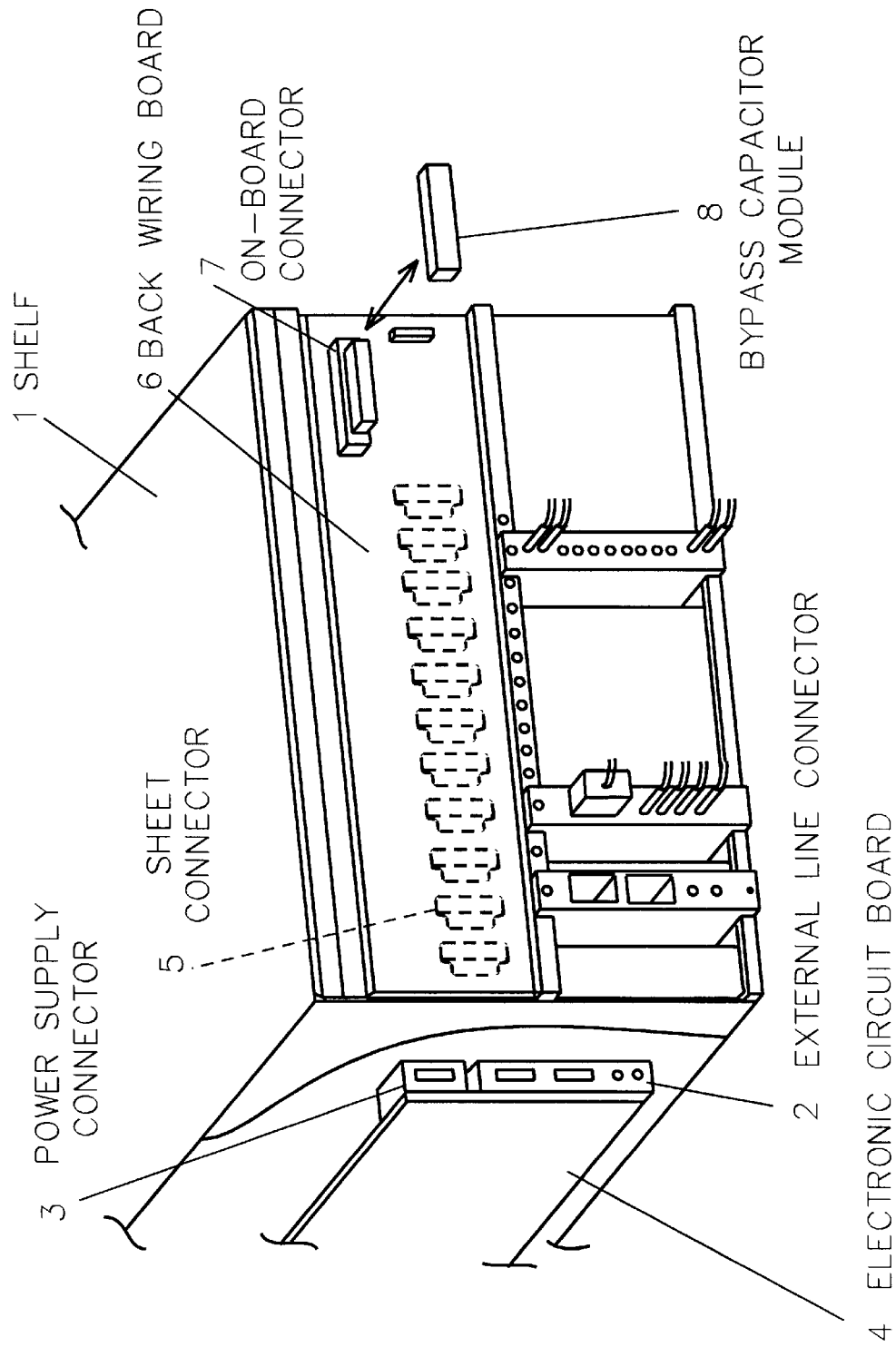
FIG. 1 is a view of a communication apparatus of the present invention, illustrating the principles thereof.
Figure 2:
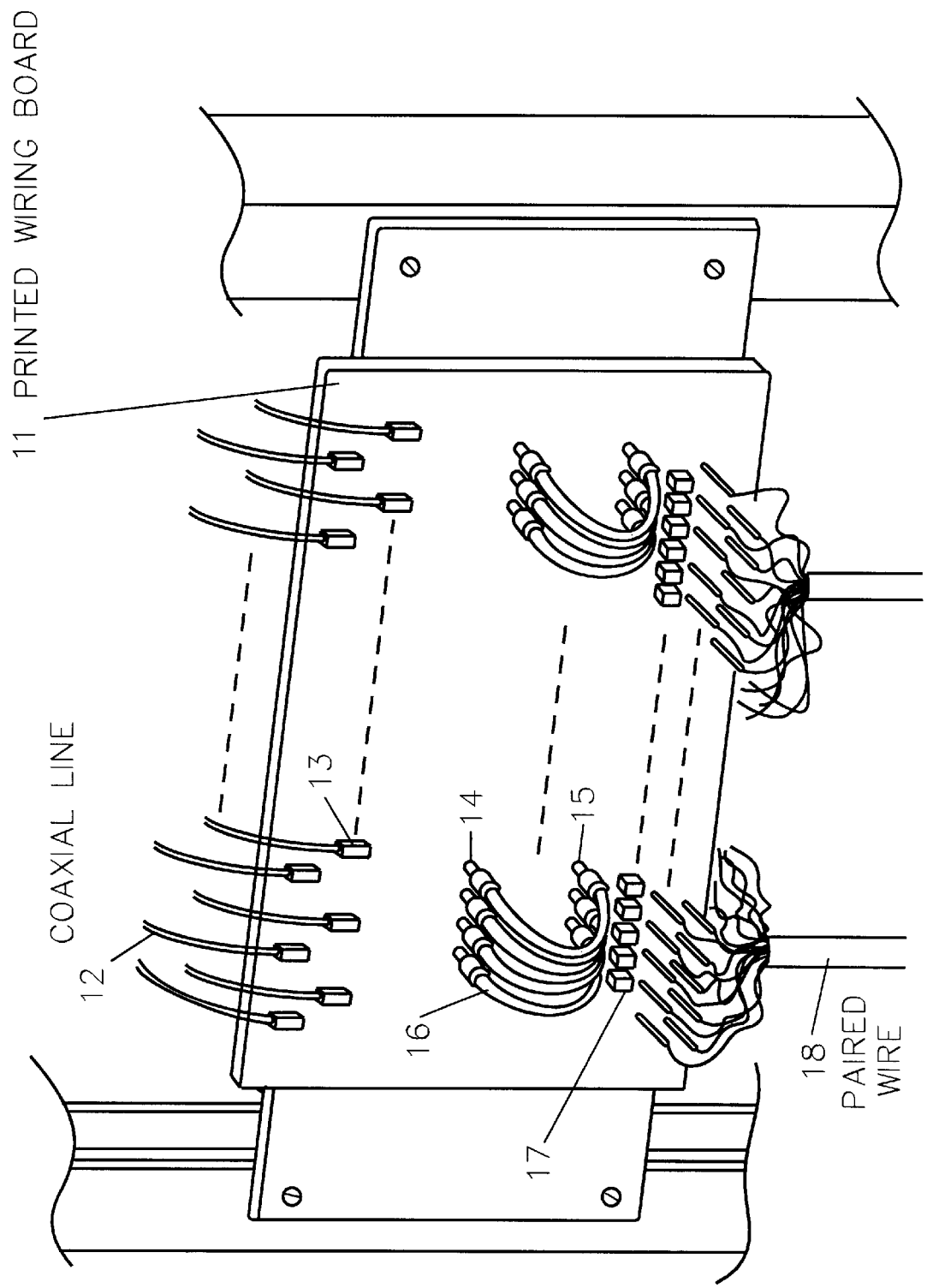
FIG. 2 is a view of a DDF device of the present invention, illustrating the principles thereof.

FIGS. 1 and 2 illustrate the principles of the present invention whereby the aforementioned objects are achieved.

FIG. 1 shows a communication apparatus as viewed from the rear side thereof. The communication apparatus comprises a shelf 1 which is mounted on an open rack, an electronic circuit board 4 mounted to the shelf 1 and having connectors 2 for external lines and a power supply connector 3, and a back wiring board 6 arranged at the rear of the shelf 1 and having sheet connectors 5 connected to the power supply connector 3 of the electronic circuit board 4.

The communication apparatus of the present invention further comprises an on-board connector 7 arranged on the back wiring board 6 and electrically connected to a power line of the board 6, and a bypass capacitor module 8 including bypass capacitors and a connector connected to the on-board connector 7. The bypass capacitors are plug-in type and thus replaceable.

FIG. 2 shows a digital distribution frame device as viewed from the front side thereof. The digital distribution frame device provides connections of signal lines from communication apparatuses. A printed wiring board 11, which is securely mounted to the rack, has coaxial terminals 13 arranged at an upper portion thereof to be connected to coaxial lines 12, and connectors 14 and 15 arranged in two rows at a middle portion thereof. The connectors 14 and 15, which are connected by jumper lines 16, permit rewiring or signal redistribution and serve as points of measurement in cases where signals are to be monitored. Below the connectors 15 are arranged converting means 17 for converting unbalanced signals, supplied from low-frequency-side apparatuses via the coaxial lines 12, to balanced signals. Further, terminals for outputting balanced signals are arranged below the converting means 17 and connected to paired wires 18 extending to high-frequency-side apparatuses.

In the communication apparatus of the present invention provided with the above-described elements, the shelf 1 is mounted on an open rack, the electronic circuit board 4 mounted to the shelf 1 is supplied with power from the back wiring board 6, and external lines, such as office cables for interconnecting external electronic devices and cables for interconnecting the electronic circuit boards, are guided to the apparatus directly through the back of the shelf 1. This arrangement permits the combinations of connections of external cables to be freely changed at the rear side of the shelf, facilitating the addition or modification of the system after the connection of office cables is once completed.

Further, the bypass capacitor module 8 is detachable and the bypass capacitors connected to the back wiring board 6 are plug-in type and thus replaceable. Accordingly, even if a sudden fluctuation occurs in the power supply voltage, such fluctuation is absorbed by the bypass capacitors electrically connected to the power line, and the bypass capacitors can be replaced with ease when the service life thereof expires.

The digital distribution frame device includes the converting means 17 for converting unbalanced signals to balanced signals. Therefore, only one type of wire, i.e., paired wire, can be used for the input/output signal lines connected to the high-frequency apparatuses, thus facilitating the connection of signal lines to the high-frequency apparatuses and reducing the mounting space.

The embodiments of the present invention will be now described in detail.

Figure 3:
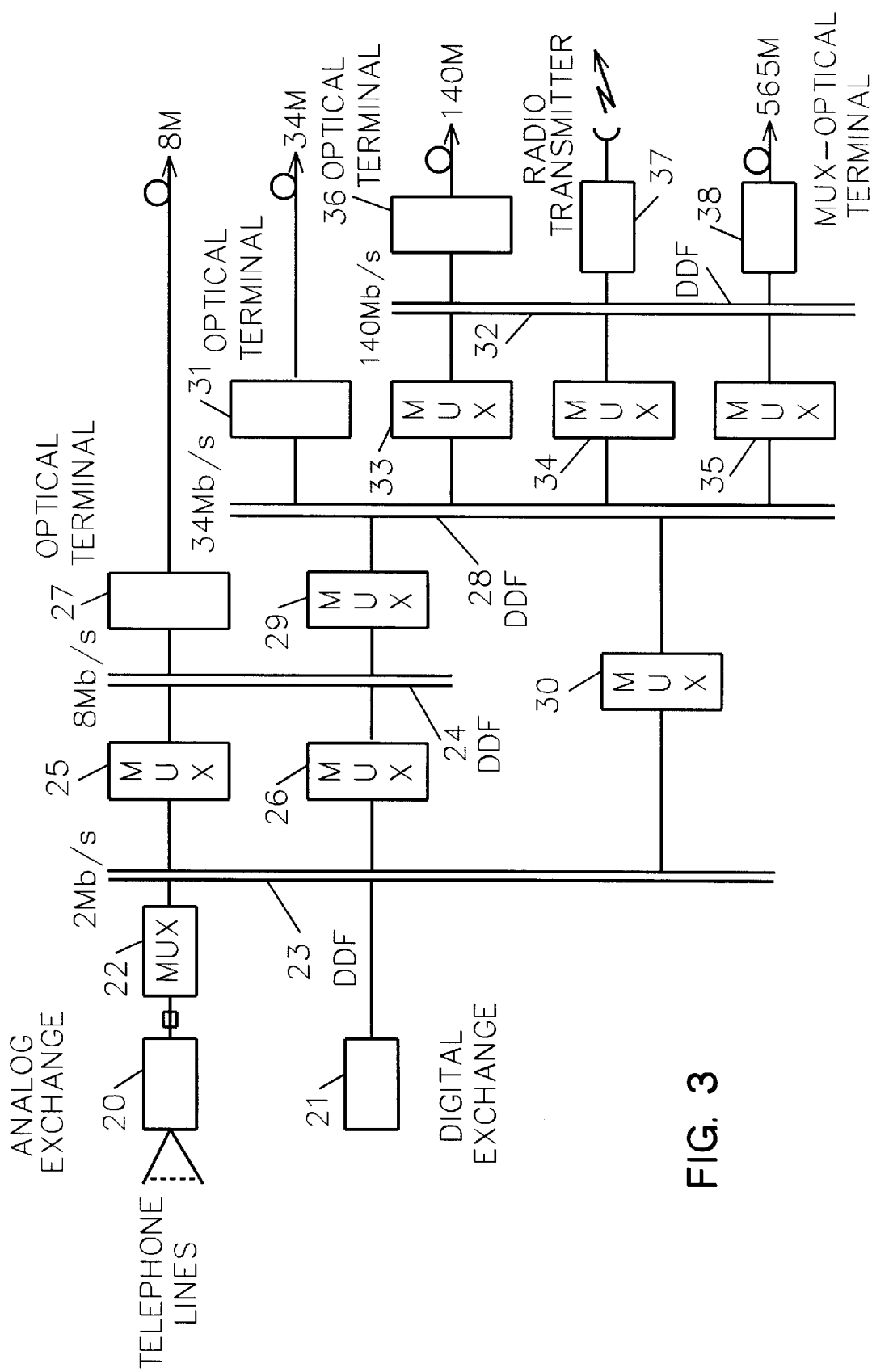
FIG. 3 is a diagram showing an example of a transmission system to which the present invention is applied.

FIG. 3 shows an example of a transmission system to which the present invention is applied. In the figure, reference numeral 20 denotes an analog exchange connected to telephone lines, 21 denotes a digital exchange for data communications, and 22 denotes a multiplexer for multiplexing signals up to a transmission speed of 2 Mb/s, the multiplexer 22 and the digital exchange 21 being connected to a digital distribution frame (DDF) device 23. Between the DDF device 23 and another DDF device 24 are connected multiplexers 25 and 26 each for multiplexing signals up to a transmission speed of 8 Mb/s. The DDF device 24 is connected to an optical terminal equipment 27, which in turn is connected to an 8-Mb/s optical communication channel. Between the DDF device 24 and another DDF device 28 is connected a multiplexer 29 for multiplexing signals up to a transmission speed of 34 Mb/s, and between the DDF devices 23 and 28 is connected a multiplexer 30 for multiplexing signals from a transmission speed of 2 Mb/s to 34 Mb/s. The DDF device 28 is connected to an optical terminal equipment 31, which in turn is connected to a 34-Mb/s optical communication channel. Further, between the DDF device 28 and still another DDF device 32 are connected three multiplexers 33, 34 and 35 each for multiplexing signals up to a transmission speed of 140 Mb/s. The DDF device 32 is connected to a 140-Mb/s optical terminal equipment 36, a radio transmitter 37, and a multiplexer-optical terminal equipment 38 for multiplexing signals to an even higher speed, e.g., 565 Mb/s, and converting the multiplexed signals to optical signals.

In the communication apparatus according to the present invention, the multiplexers 25, 26, 29, 30, 33, 34 and 35 and the optical terminal equipments 31 and 36 are each integrated into a single electronic circuit board, and the terminals of input/output signal cables are guided directly to the individual electronic circuit boards.

Figure 4:
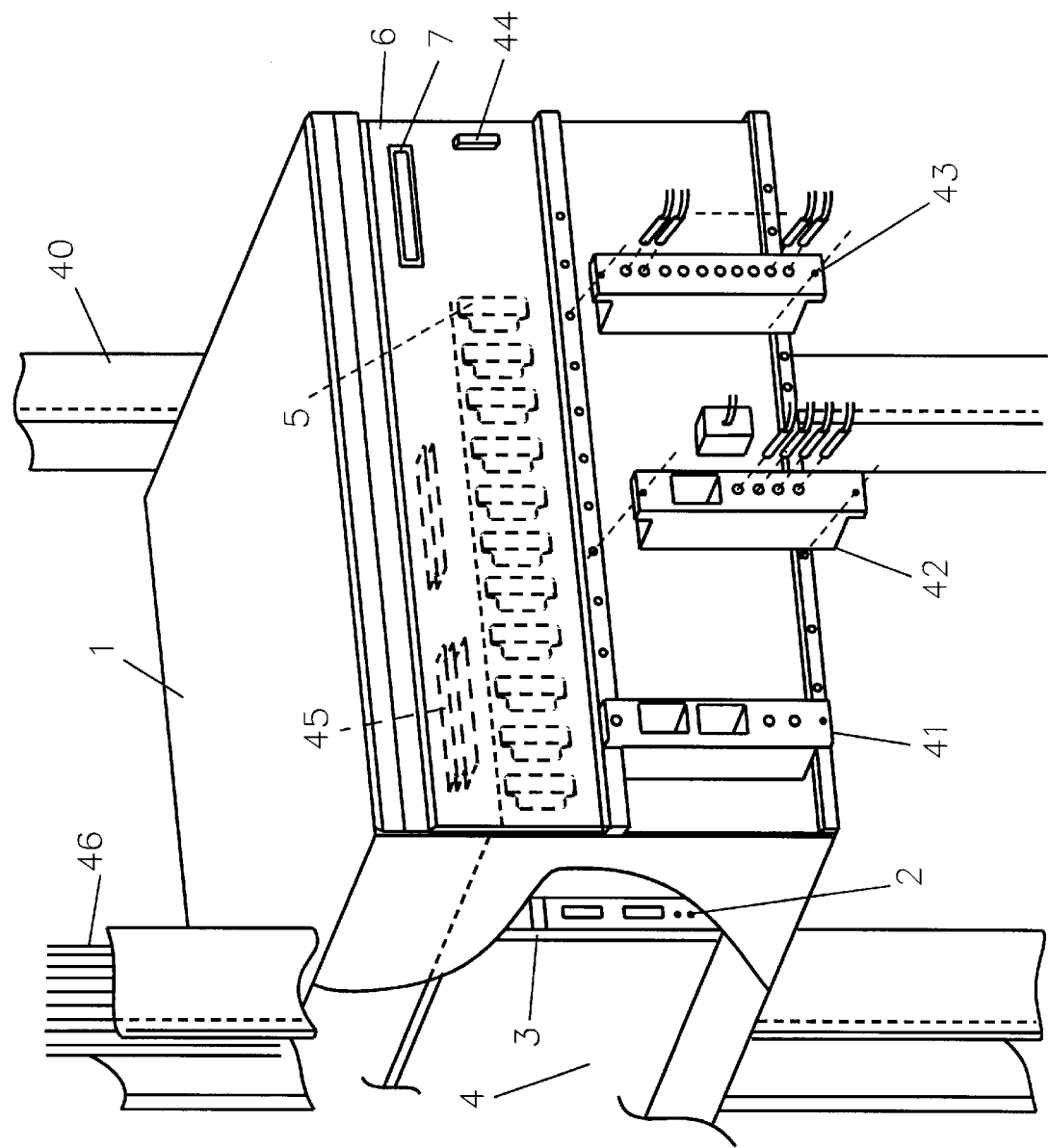
FIG. 4 is a view of a communication apparatus according to an embodiment of the present invention.

FIG. 4 shows an example of the communication apparatus as viewed from the rear side thereof. The shelf 1 for receiving electronic circuit boards is securely attached to a shelf mounting rack 40. The back wiring board 6, which provides electrical connections among the electronic circuit boards 4, is arranged at the rear end of the shelf 1, and also shrouds 41, 42 and 43 are securely fixed to the rear of the shelf 1. The shrouds 41 to 43 each serve to hold in position the corresponding external line connectors 2 formed at the rear of each electronic circuit board 4 when the board 4 has been inserted from the front side of the shelf 1.

On the rear surface of the back wiring board 6 are provided a power receiving terminal 44 for receiving electric power from outside, and the on-board connector 7 to which a connector equipped with a bypass capacitor module is connected. The sheet connectors 5 are arranged on the front surface of the back wiring board 6 to be connected to the power supply connectors 3 formed on the rear ends of the individual electronic circuit boards 4. Power received via the receiving terminal 44 is supplied to the electronic circuit boards 4 through the sheet connectors 5 of the back wiring board 6. In addition to the power line, an alarm signal line and a microcomputer bus are laid on the back wiring board 6. An alarm signal output connector 45 is arranged on the front surface of the back wiring board 6 so as to allow an alarm signal to be output to the outside, and when a fault occurs in any electronic circuit board 4, a lamp on another shelf mounted to the same rack 40, for example, is lighted via the alarm signal output connector 45.

Office cables 46 for interconnecting external electronic devices are extended along a side groove of the open rack 40 and guided to the vicinity of the shelf 1 mounted to the open rack 40. End portions of the office cables 46 are passed over the rear side wall of the open rack 40 toward the back of the shelf if i.e., toward the shrouds 41, 42 and 43 attached to the shelf 1.

Figure 5:
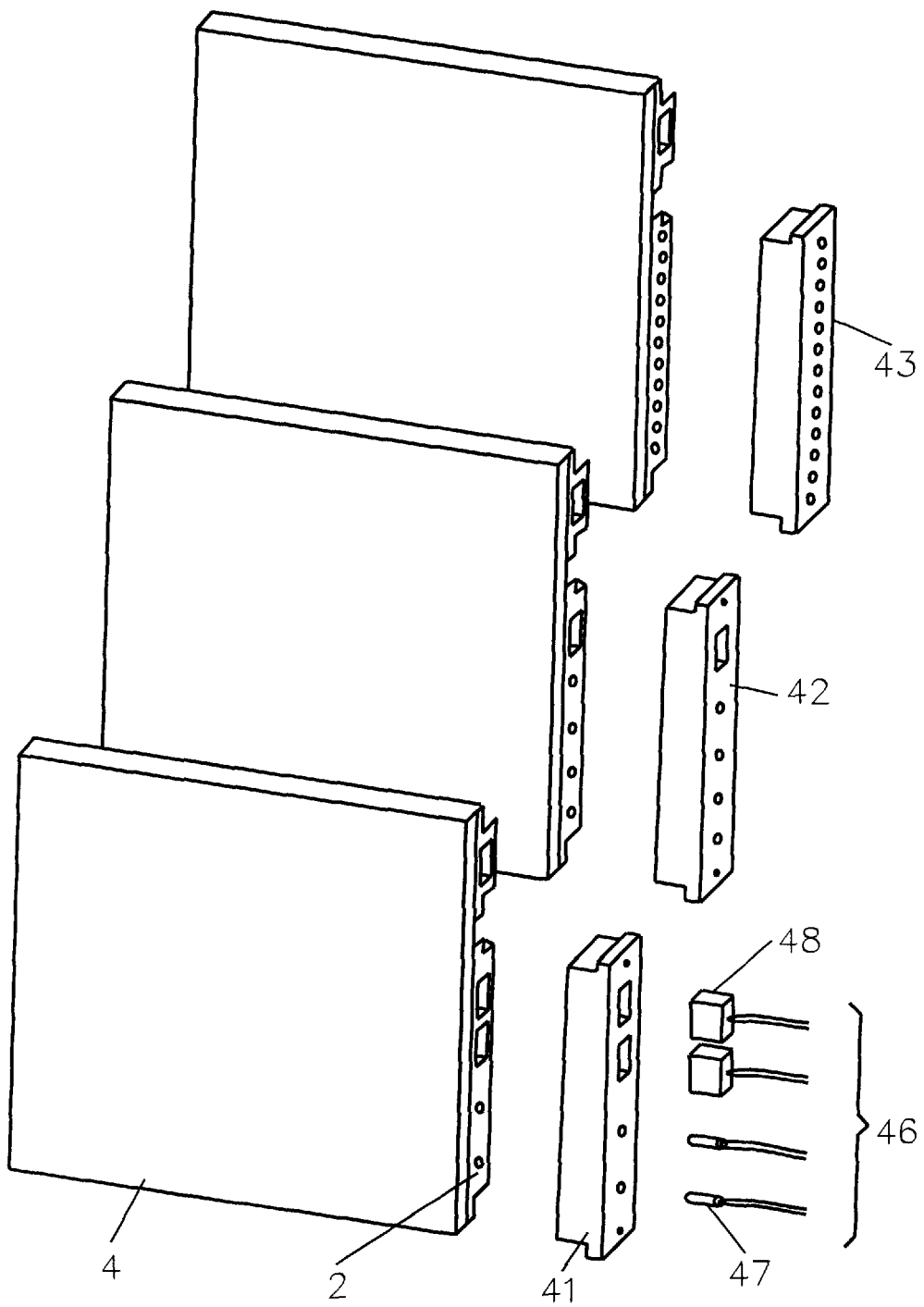
FIG. 5 is a view illustrating how electronic circuit boards are connected to external lines.

FIG. 5 shows how the electronic circuit boards are connected to external lines. As illustrated in the figure, the shrouds 41, 42 and 43 attached to the back of the shelf 1 have different shapes according to types of the external line connectors 2 of the electronic circuit boards 4 mounted to the shelf 1. In this embodiment, the shrouds 41, 42 and 43 merely provide mechanical support for the external connectors 2, but they may be designed to function as electrical junctions. Thus, the shrouds 41, 42 and 43 serve to fix in position the corresponding electronic circuit boards 4 when the boards 4 are mounted, and also serve to guide coaxial connectors 47 and flat connectors 48 connected to the office cables 46.

The shrouds 41, 42 and 43 can be attached to and detached from the shelf 1 from the rear side thereof, and the coaxial connectors 47 and flat connectors 48 connected to the office cables 46 can be connected to and disconnected from the corresponding shrouds 41, 42 and 43 from the rear side of the shelf 1.

In the preferred embodiment, three types of shrouds 41, 42 and 43 are prepared. The shrouds will be explained taking the multiplexer 30 in the transmission system of FIG. 3, which carries out sixteenfold multiplexing from a transmission speed of 2 Mb/s to 34 Mb/s, as an example. Input/output signal lines connecting the multiplexer 30 to low-speed-side apparatus are all paired wires, while input/output signal lines connecting the multiplexer 30 to high-speed-side apparatus are all coaxial lines, and the multiplexer 30 includes a single 16-channel system. For the input/output with respect to the low-speed apparatus, four signal lines are required per channel, two for signal input and two for signal output, and thus the 16 channels require a total of 64 signal lines. In the case where a 36-pin connector is used for the external line connector 2 of the electronic circuit board 4, two such connectors are needed and thus the number of cables (16-pair cables) is two. On the other hand, for the input/output of signals with respect to the high-speed apparatuses, two coaxial cables are required. Accordingly, the shroud 41 having openings for guiding two flat connectors and two coaxial connectors is used for the electronic circuit board 4 serving as the multiplexer 30.

The multiplexers 25 and 26, each of which carries out fourfold multiplexing from a transmission speed of 2 Mb/s to 8 Mb/s, include two 4-channel systems. The number of signal lines connected to low-speed-side apparatus is 32 (=4 (channels)×4 (lines)×2 (systems)), thus requiring a single 16-pair cable. For the connection with high-speed-side apparatus, four coaxial cables are needed because signal input and output lines must be provided for each of the two systems. Accordingly, the shroud 42 having openings for guiding one flat connector and four coaxial cables is used for each of the multiplexers 25 and 26.

In the case of the multiplexers 29, 33, 34 and 35 each for carrying out fourfold multiplexing, four signal lines are connected to low-speed-side apparatus while one signal line is connected to high-speed-side apparatus, and thus a total of 10 coaxial connectors is required for the input/output of signals. The optical terminal equipments 26, 30 and 35 each require two signal lines for input/output. Further, a switching device for switching between the multiplexers requires six coaxial cables, and an automatic protective switching control device for controlling the switching device requires 12 coaxial cables. Accordingly, the electronic circuit board having these functions requires 12 coaxial cables at the maximum, and the shroud 43 having openings for guiding 12 coaxial cables is used for this electronic circuit board.

Figure 6:
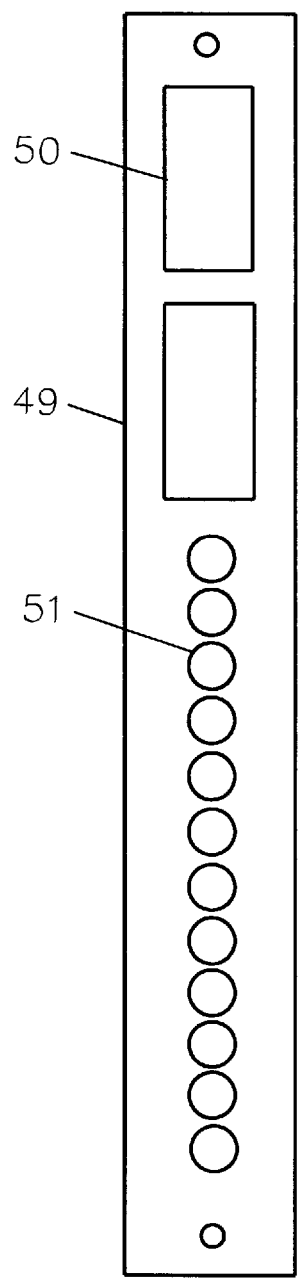
FIG. 6 is a view showing another example of a shroud.

FIG. 6 shows another example of the shroud. The shroud 49 of this example has two openings 50 each for guiding a flat connector connected to a paired wire, and twelve openings 51 each for guiding a coaxial connector, the openings 50 and 51 being arranged in a line. Use of the shroud 49 makes it unnecessary to prepare shrouds of different shapes; that is, only one type shroud suffices. In this case, connector housings containing the external line connectors 2 of the individual electronic circuit boards can be formed as a single type.

Figure 7:
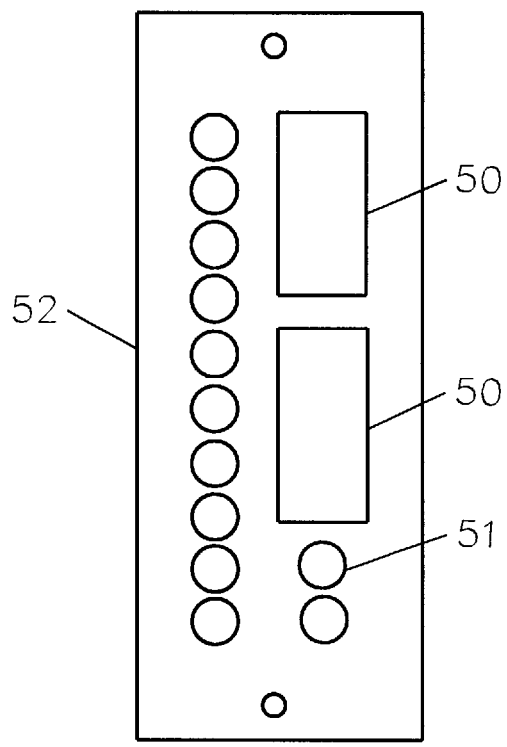
FIG. 7 is a view showing still another example of the shroud.

FIG. 7 shows still another example of the shroud. As illustrated, the shroud 52 has two openings 50 each for guiding a flat connector connected to a paired wire, and twelve openings 51 each for guiding a coaxial connector. The two openings 50 and two of the openings 51 are arranged in a line, and also the remaining ten openings 51 are arranged in a line, thus forming two rows of openings. Use of the shroud 52 makes it unnecessary to prepare shrouds of different shapes; that is, only one type shroud suffices.

Figure 8:
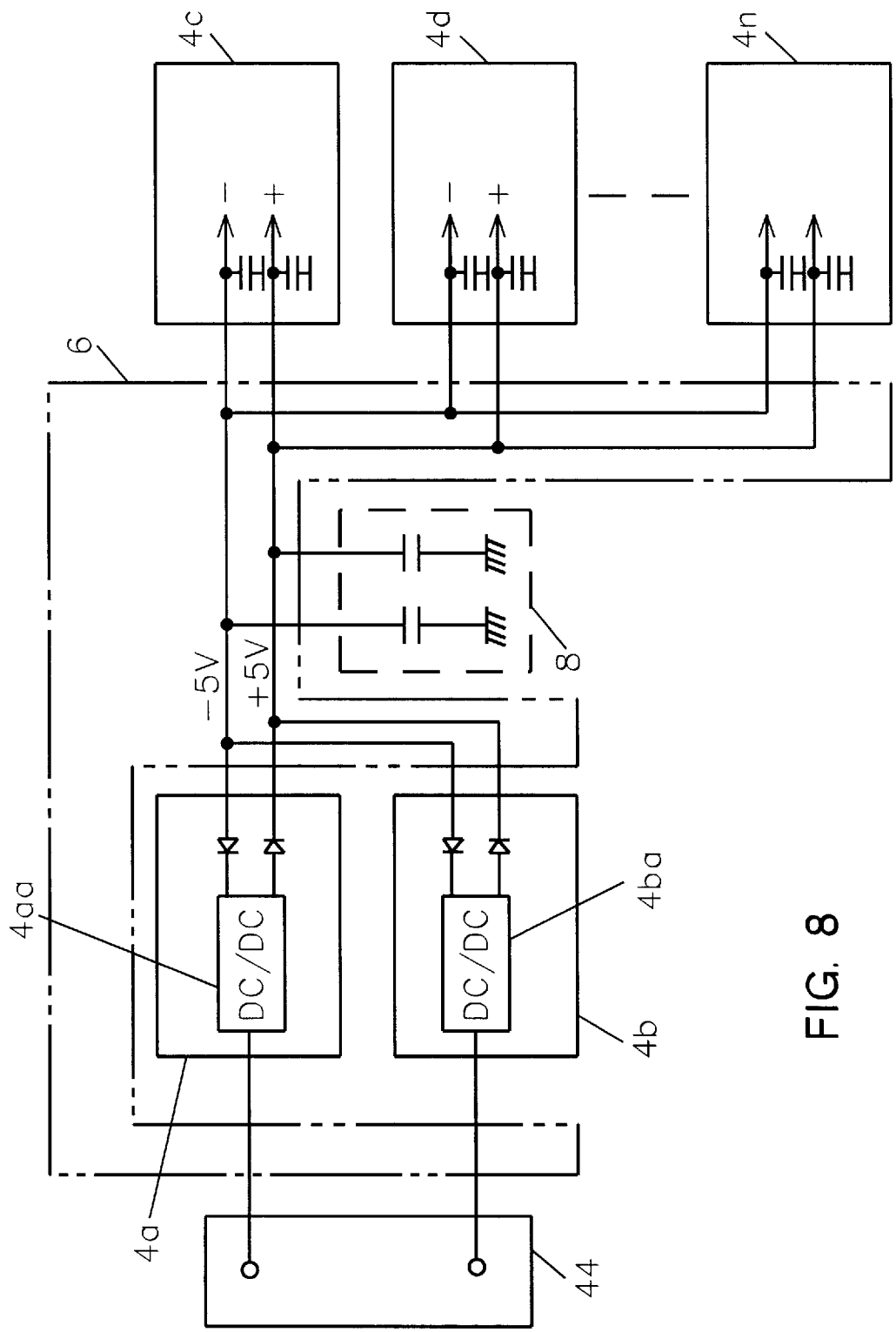
FIG. 8 is a diagram showing a power circuit of the communication apparatus.

FIG. 8 illustrates a power circuit of the communication apparatus. As electronic circuit boards mounted to the shelf 1, the figure illustrates two power supply packages 4*a* and 4*b*, and a plurality of load-side packages 4*c*, 4*d*, ..., 4*n* such as multiplexers. For the purpose of redundant operation of in-house power supply, two power supply packages 4*a* and 4*b* of the same arrangement are mounted on the same shelf 1 as packages for current use and standby reserve, and are operated in parallel. Normally, the power supply packages 4*a* and 4*b* each bear half of the power load, and in case one package fails, the other power supply package bears all power load. Accordingly, each of the power supply packages 4*a* and 4*b* having the same arrangement has a power capacity sufficient to drive all of the load-side packages 4*c* to 4*n*.

The power receiving terminal 44 is connected to the power supply packages 4*a* and 4*b* via the sheet connectors 5 of the back wiring board 6. The power supply packages 4*a* and 4*b* include DC/DC converters 4*aa* and 4*ba*, respectively, for converting the voltage applied thereto from the receiving terminal, for example, −48 V, to a voltage of ±5 V. Voltage output terminals of the power supply packages 4*a* and 4*b* are connected to ±5-V power lines of the back wiring board 6, and further connected to the sheet connectors 5 associated with the load-side packages 4*c* to 4*n*. The bypass capacitor module 8 is connected in parallel to the power lines extending from the power supply packages 4*a* and 4*b* to the loads. The bypass capacitor module 8 is detachably connected to the load-side power lines of the power supply packages 4*a* and 4*b* via the on-board connector 7 formed on the back wiring board 6.

Figure 9:
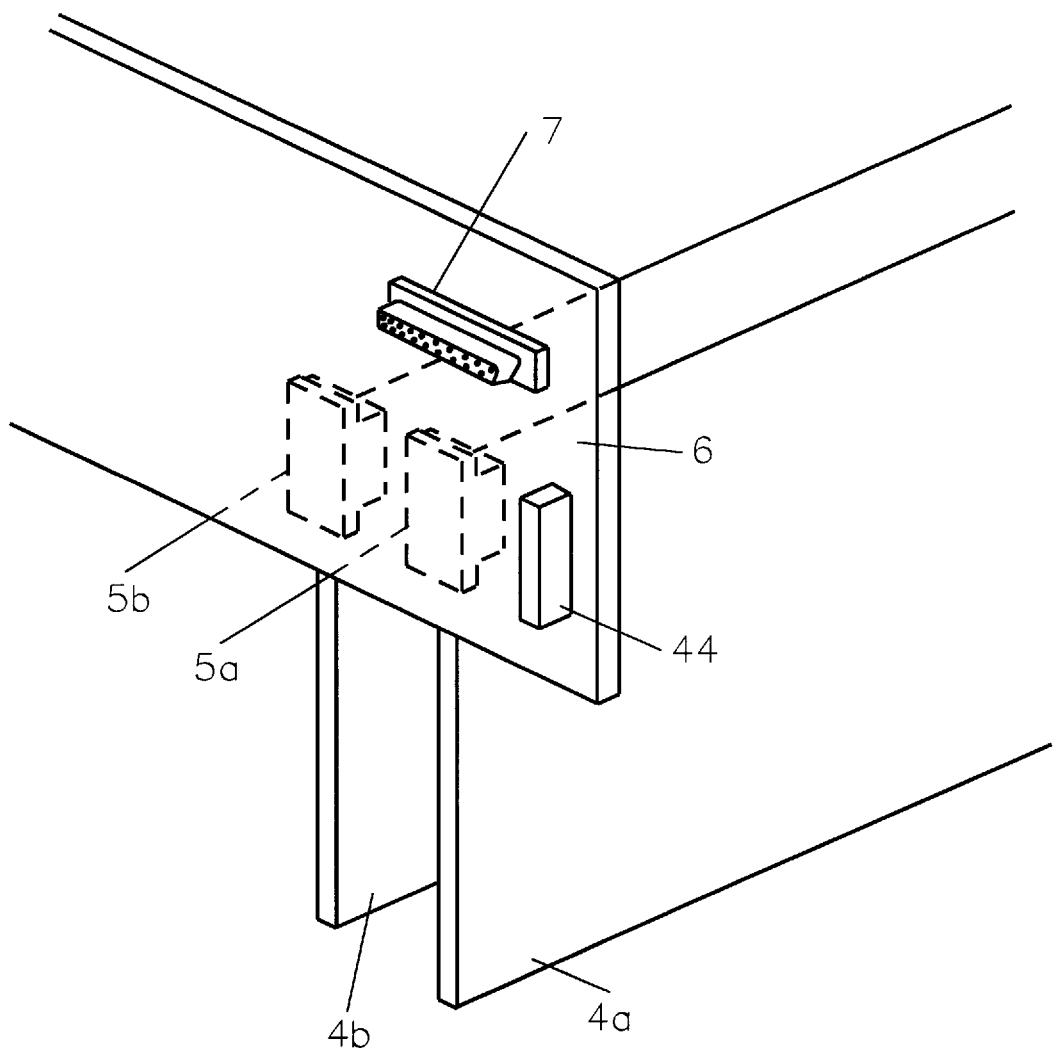
FIG. 9 is a view showing in detail the location where power supply packages are mounted.

FIG. 9 shows in detail the location where the power supply packages are arranged. Although the mounting positions for the load-side packages are not particularly limited, the locations of sheet connectors 5*a* and 5*b* for the power supply packages 4*a* and 4*b* are determined as illustrated. Namely, the sheet connectors 5*a* and 5*b*, the on-board connector 7 and the power receiving terminal 44 are arranged on the back wiring board 6 so as to be close to one another. The on-board connector 7, in particular, is located as close to the sheet connectors 5*a* and 5*b* for the power supply packages 4*a* and 4*b* as possible, that is, at the smallest possible distance from the load-side outputs for the power supply packages 4*a* and 4*b*.

Figure 10:
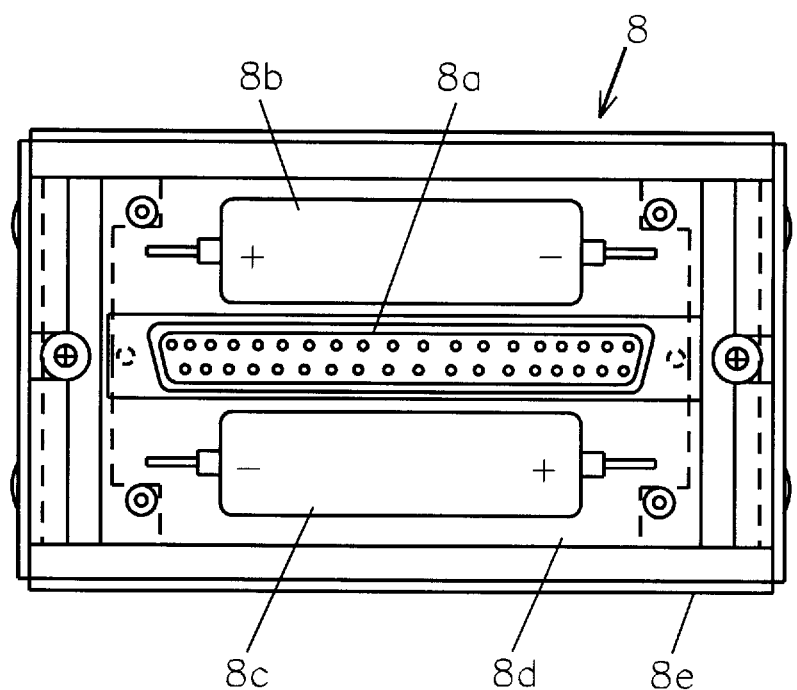
FIG. 10 is a view showing details of a bypass capacitor module.

FIG. 10 shows details of the bypass capacitor module. The bypass capacitor module 8 comprises a connector 8*a* to be connected to the on-board connector 7 of the back wiring board 6, two polar electrolytic capacitors 8*b* and 8*c* for positive and negative power supply, a printed board 8*d* for mounting the elements 8a, 8b and 8c thereon, and a casing 8e housing the elements 8a to 8d. The connector 8a and the capacitors 8b and 8c are mounted on the same plane of the printed board 8d, and the two capacitors 8b and 8c are located on opposite sides of the connector 8a.

Figure 11:
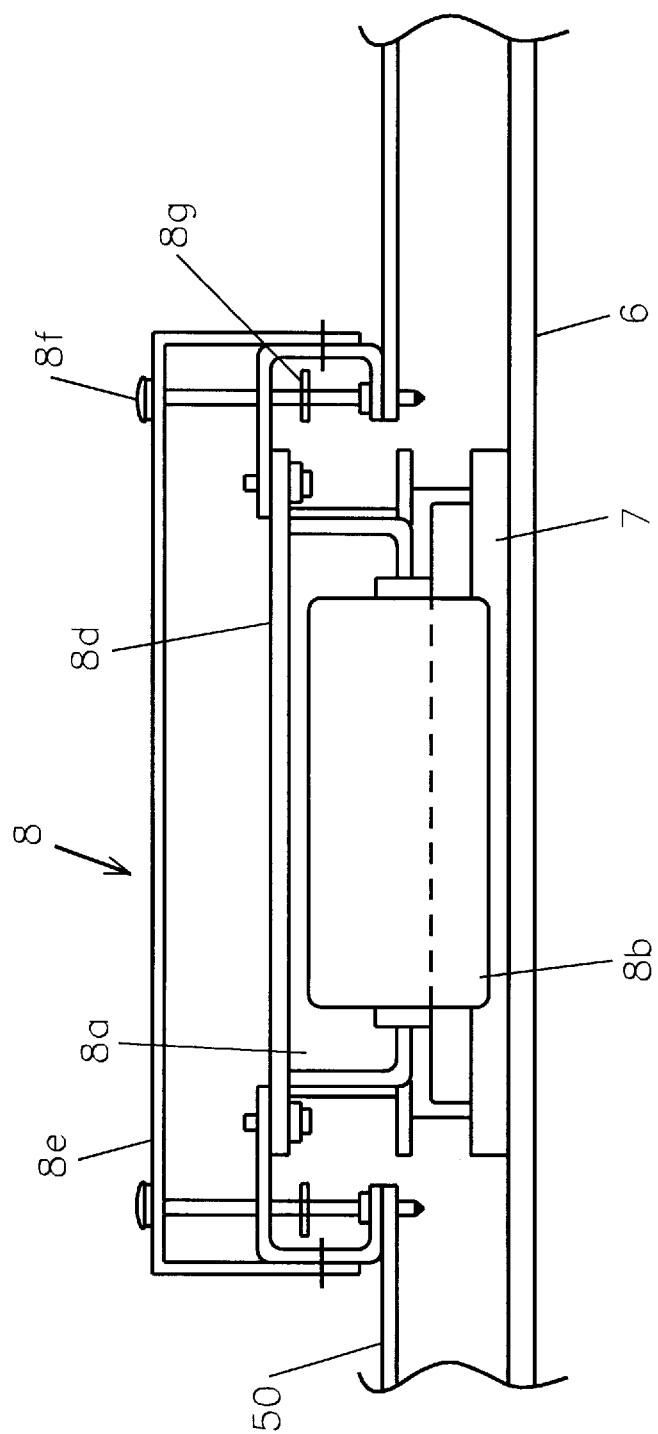
FIG. 11 is a view showing, in section, the mounted bypass capacitor module.

FIG. 11 shows, in section, the bypass capacitor module in a mounted state. The bypass capacitor module 8 is mounted in the following manner: First, a rear cover 50 for the back wiring board 6 is attached to the shelf 1 over the rear surface of the board 6, and then the bypass capacitor module 8 is connected to the on-board connector 7 through an opening cut in the rear cover 50. In addition to the coupling between the connector 8a of the bypass capacitor module 8 and the on-board connector 7, the module 8 is firmly secured to the rear cover 50. Namely, the casing 8e of the bypass capacitor module 8 is provided with headed screws 8f and stopper washers 8g, and the headed screws 8f are screwed into tapped holes cut in the rear cover 50, whereby the casing 8e is firmly attached to the rear cover 50.

Since the bypass capacitor module 8 is a plug-in type, the capacitors permit easy replacement when the service life thereof expires, and both the capacitors 8b and 8c for positive and negative power supply can be replaced with new ones at the same time. Further, when the capacitors 8b and 8c are mounted on the printed board 8d, the capacitors 8b and 8c and the connector 8e are situated on the same plane so that the capacitors 8b and 8c may be located in the space defined between the rear over 50 and the back wiring board 6. Consequently, the bypass capacitor module 8 can be reduced in height and the rearward projection of the casing 8e from the rear cover 50 is small.

The capacitors 8b and 8c are connected to the load-side power lines of the power supply packages 4a and 4b, and thus can lessen voltage fluctuations of the power lines. Namely, when the power supply package 4a or 4b requires replacement because of fault, it must be removed. In this case, the normal or remaining power supply package 4a or 4b must be controlled so as to provide an output current twice as large as that it has been outputting. The DC/DC converter does not respond instantly; however, the deficiency of the current is compensated for by the capacitor 8b or 8c until the output voltage reaches a steady state, whereby sudden voltage fluctuations of the power lines can be minimized. Conversely, when a power supply package is added for parallel operation, the DC/DC converter suppresses voltage fluctuations until the current supplied is reduced to half.

Also, the load-side packages 4c to 4n need be removed or relocated where a package requires replacement because of fault or channel interfaces must be changed or added. In this case, an instantaneous voltage drop occurs due to sudden change in the load current, but such instantaneous voltage drop is absorbed by the capacitors 8b and 8c, whereby channel errors due to erroneous operation of the load-side packages can be prevented.

Figure 12:
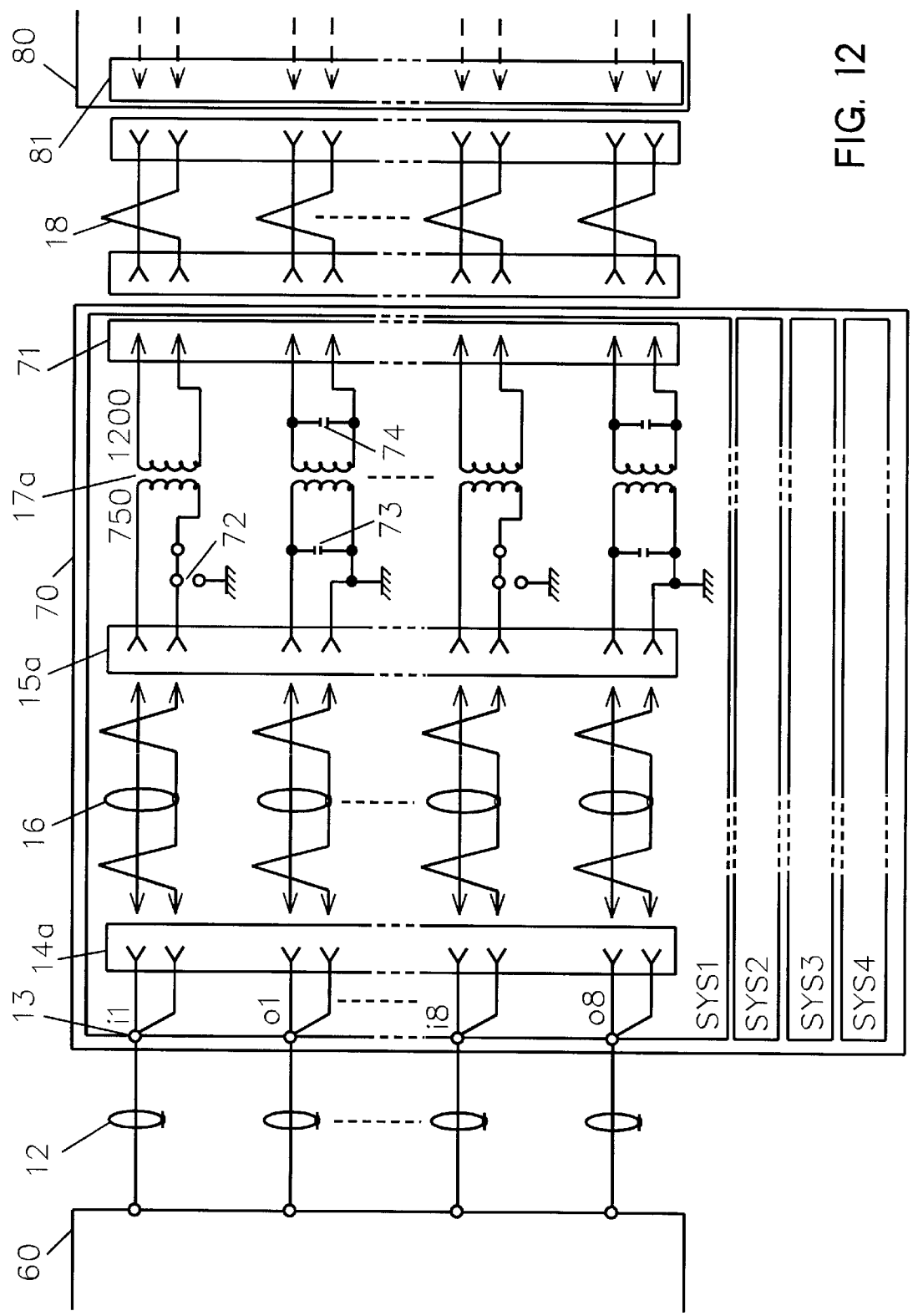
FIG. 12 is a circuit diagram showing an example of a DDF device.

FIG. 12 is a circuit diagram showing an example of the DDF device. The DDF device is used for the interconnection of apparatus, and is connected by paired wires to high-frequency-side apparatus which contains a large number of bulky 75-Ω coaxial lines and thus has little mounting space. For example, the illustrated DDF device is the device 23 in the transmission system shown in FIG. 3, and the interfacing with low-frequency-side apparatus is achieved by 75-Ω coaxial lines.

In FIG. 12, reference numeral 60 denotes a low-frequency-side apparatus, 70 denotes a low-frequency 75-Ω DDF device, and 80 denotes a high-frequency-side apparatus. The low-frequency 75-Ω DDF device 70 has coaxial terminals 13 to which the coaxial lines 12 from the low-frequency apparatus 60 are respectively connected. The coaxial terminals 13 are provided according to the number of channels to be connected; for example, in the case of eight channels, 16 input/output coaxial terminals are provided wherein eight terminals are associated with input lines i1 to i8 and the remaining eight lines are associated with output lines o1 to o8. In the illustrated example, eight channels constitute one system, and four such systems SYS1, SYS2, SYS3 and SYS4 are provided. The coaxial terminals 13 are connected to a 32-pin flat connector 14a. The flat connector 14a serves as a junction where the connectors of the jumper lines 16 are connected. Also, during maintenance work or the like, connectors of measurement cables are connected to the flat connector 14a, in which case the junction serves as the point of measurement of the signals from the low-frequency apparatus. Connectors at the other ends of the jumper lines 16 are connected to a 32-pin flat connector 15a, which serves as the point of measurement of the signals from the high-frequency apparatus. The connections of the jumper lines 16 with respect to the flat connectors 14a and 15a can be freely changed; accordingly, the low-frequency 75-Ω DDF device 70 has a line switching function.

The flat connector 15a is connected to a 32-pin flat connector 71 via transformers 17a, each of which performs balanced signal-to-unbalanced signal conversion. In the channels for signal input from the low-frequency apparatus 60, grounding terminals 72, which are configured according to customer's needs, are connected to the lines extending from the flat connector 15a to the transformers 17a. In each channel for signal output to the low-frequency apparatus 60, capacitors 74 and 73 for correcting waveform deterioration are connected in parallel to signal input and output terminals, respectively, of the transformer 17a. The connection between the low-frequency 75-Ω DDF device 70 and the high-frequency apparatus 80 is achieved by the paired wires 18 connecting the flat connector 71 of the DDF device 70 to a flat connector 81 of the high-frequency apparatus 80. In this example, 8-channel paired wires 18 are bundled into a single cable (16-pair cable) having a 32-pin flat connector at each end.

Figure 13:
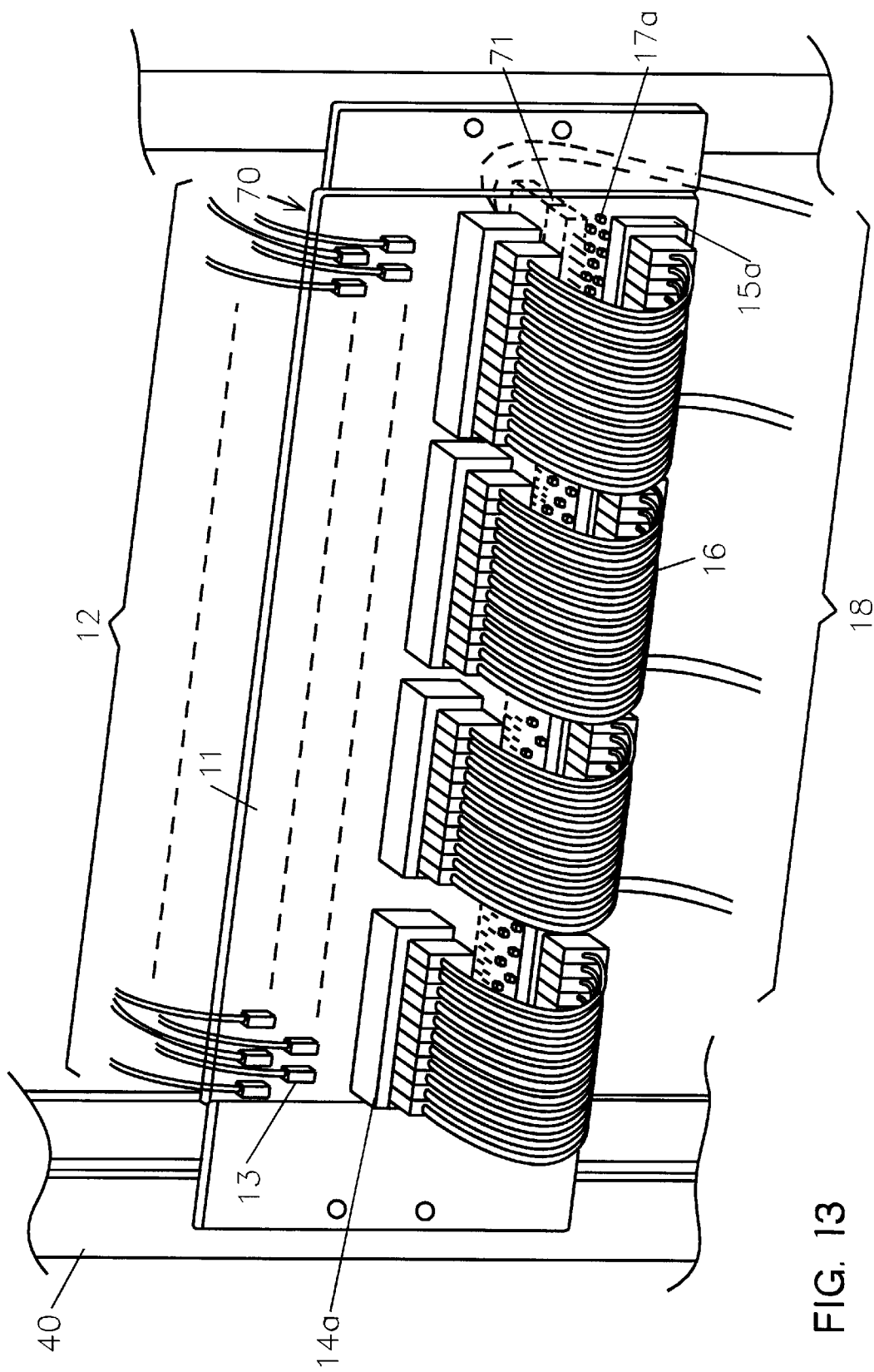
FIG. 13 is a view showing an example of how the DDF device is mounted to a rack.

FIG. 13 shows an example of how the DDF device is mounted on the rack. The figure illustrates a state in which the low-frequency 75-Ω DDF device 70 is mounted to the front side of the shelf mounting rack 40, and as illustrated, four 8-channel systems are incorporated. The coaxial terminals 13 are arranged at an upper portion of the front side of the printed wiring board 11 in two rows, each row including 32 terminals. Four flat connectors 14a and four flat connectors 15a, to which the jumper lines 16 are connected, are arranged on the front side of the printed wiring board 11. Sixty-four transformers 17a, 32 grounding terminals 72, and 64 capacitors 73 and 74 are arranged on the front side of the printed wiring board 11 between the row of the flat connectors 14a and the other row of the flat connectors 15a. Four flat connectors 71 connected to high-frequency-side apparatus are mounted on the rear surface of the printed wiring board 11. Accordingly, the connection of the coaxial lines 12 to the coaxial terminals 13, the wiring or rewiring of the jumper lines 16, and the connection of the measurement cables to the flat connectors 14a and 15a can be carried out from the front side of the wiring board.

Where eight channels from the low-frequency apparatus 60 constitute one system and four such systems are provided, as in the above example, the number of the coaxial lines 12 from the low-frequency apparatus 60 and the number of the jumper lines 16 are 64 each. Thus, if flat connectors are used only for the connection with high-frequency-side apparatus, then the coaxial terminals 13 connected to the coaxial lines 12 and the connectors of the jumper lines 16 amount to 192 in number, requiring large mounting space. Therefore, shielded wires, not coaxial lines, are used for the jumper lines 16 and flat connectors are provided on both ends of the jumper lines, whereby only 64 coaxial terminals 13 suffice for the connection with the coaxial lines, permitting the jumper line connectors to be mounted to small space.

Since normal shielded wire is subject to signal deterioration, a shielded wire having an impedance of 75Ω and comprising a core wire and a drain wire twisted together, like the paired wire, is used for each jumper line 16. A 2-pin flat connector is provided on each end of the jumper line. This type of shielded wire is also used for the measurement cable which is connected to the flat connector 14a or 15a during measurement.

As described above, according to the present invention, a shelf is mounted on the open rack, the electronic circuit boards mounted to the shelf are constructed such that the connectors to which external lines are directly connected and the power supply connectors are arranged on the rear ends of the circuit boards, and the connectors to be connected to the power supply connectors are arranged on the front surface of the back wiring board. Accordingly, the system can be freely configured by wiring or rewiring office cables connected to the external line connectors at the back of the shelf. Since the shrouds are detachable, there are no restrictions on the positions of electronic circuit boards mounted to the shelf, and even after the electronic circuit boards are once mounted, the system can be freely reconfigured later.

The bypass capacitor module connected to the load-side power lines of the power supply packages is a plug-in type; therefore, the replacement and maintenance of the bypass capacitors can be quickly performed with ease. The on-board connector of the back wiring board is located at the smallest possible distance from the sheet connectors associated with the power supply packages for current use and standby reserve, and thus it is possible to minimize a noise voltage which occurs on the power supply lines when a package is attached or detached. Since a bypass capacitor for positive power supply and a bypass capacitor for negative power supply are both mounted, the module has only to be replaced in case one of the capacitors fails, whereby the channels can be immediately recovered. Further, the bypass capacitors and the connector are located on the same plane of the mounting board, and accordingly, the dimension of the apparatus in the depth direction thereof is minimized, making it possible to provide a smaller-sized shelf.

The DDF device according to the present invention has the impedance conversion function, which originally is achieved by high-frequency-side apparatus, and uses 75-Ω shielded wires for the jumper lines, whereby the total cost and the floor space occupied by the transmission system can be reduced, and the construction work of the system can be efficiently performed. Namely, the impedance of high-frequency apparatus can be restricted to 120Ω and thus the apparatus is not required to have the impedance conversion function, which leads to a reduction in the cost. The lines from the high-frequency apparatus are connected to the DDF device by connectors and multiconductor paired cables can be used for this purpose, whereby the number of cables and the wiring space can be reduced and the construction work of the system can be performed efficiently. Further, since shielded wires are used for the jumper lines, the number of coaxial lines and thus the mounting space can be reduced and thus the number of channels can be increased.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication apparatus for converting an unbalanced signal into a balanced signal, comprising:

coaxial terminals to which coaxial lines from a low-frequency-side apparatus are respectively connected, a first signal measurement point having junctions which are respectively connected to the coaxial terminals, a second signal measurement point having junctions to which jumper lines are connected with the junctions of the first signal measurement point, and means for converting an unbalanced signal, supplied from the low-frequency-side apparatus via the coaxial lines and the jumper lines, into a balanced signal which is supplied to a high-frequency-side apparatus.

2. The communication apparatus for converting an unbalanced signal into a balanced signal as in claim 1, said jumper lines connecting the first signal measurement point to the second signal measurement point having an impedance equal to that of the coaxial line, and including shielded wires having flat connectors at both ends thereof.

* * * * *